US006437385B1

United States Patent
Bertin et al.

(10) Patent No.: US 6,437,385 B1
(45) Date of Patent: Aug. 20, 2002

(54) INTEGRATED CIRCUIT CAPACITOR

(75) Inventors: Claude L. Bertin, South Burlington; Thomas M. Maffitt, Burlington; Wilbur D. Pricer, Charlotte; William R. Tonti, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/607,094

(22) Filed: Jun. 29, 2000

(51) Int. Cl.$^7$ ................ H01L 27/108; H01L 29/76; H01L 29/94; H01L 31/119
(52) U.S. Cl. ................ 257/301; 257/302
(58) Field of Search ............... 257/295–310; 438/243–253, 396–398; 361/310–314

(56) References Cited

U.S. PATENT DOCUMENTS

| | | |
|---|---|---|
| 4,685,197 A | 8/1987 | Tigelaar et al. |
| 4,700,457 A | 10/1987 | Matsukawa |
| 4,827,323 A | 5/1989 | Tigelaar et al. |
| 5,103,283 A | 4/1992 | Hite |
| 5,155,657 A | 10/1992 | Oehrlein et al. |
| 5,583,359 A | 12/1996 | Ng et al. |
| 5,708,559 A | 1/1998 | Brabazon et al. |
| 5,744,853 A | 4/1998 | Quek et al. |
| 5,753,948 A | 5/1998 | Nguyen et al. |
| 5,838,045 A | 11/1998 | Muller et al. |
| 5,898,982 A | 5/1999 | Metzler et al. |
| 5,903,050 A | 5/1999 | Thurairajaratnam et al. |
| 5,909,350 A | 6/1999 | Anthony |

Primary Examiner—Tom Thomas
Assistant Examiner—Cuong Quang Nguyen
(74) Attorney, Agent, or Firm—Whitham, Curtis & Christofferson, P.C.; Mark F. Chadurjian

(57) ABSTRACT

Use of different materials for different conductive films forming plates or electrodes of one or more capacitors formed in a trench in a body of semiconductor materials allow connections to be made selectively to the plates. The films may be undercut by different etchants at respective connection apertures to avoid formation of connections or connections made by doped polysilicon of different conductivities forming connections to some plates of similarly doped polysilicon and blocking diode junctions with oppositely doped polysilicon. The blocking diodes may include a compensation implant to adjust reverse breakdown characteristics and provide transient and electrostatic discharge protection.

12 Claims, 4 Drawing Sheets

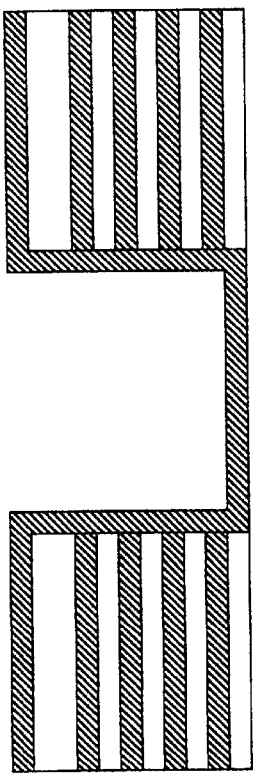 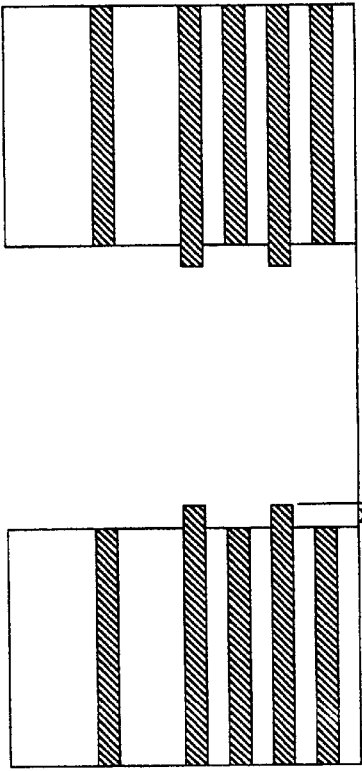
FIG. 3A
FIG. 3B

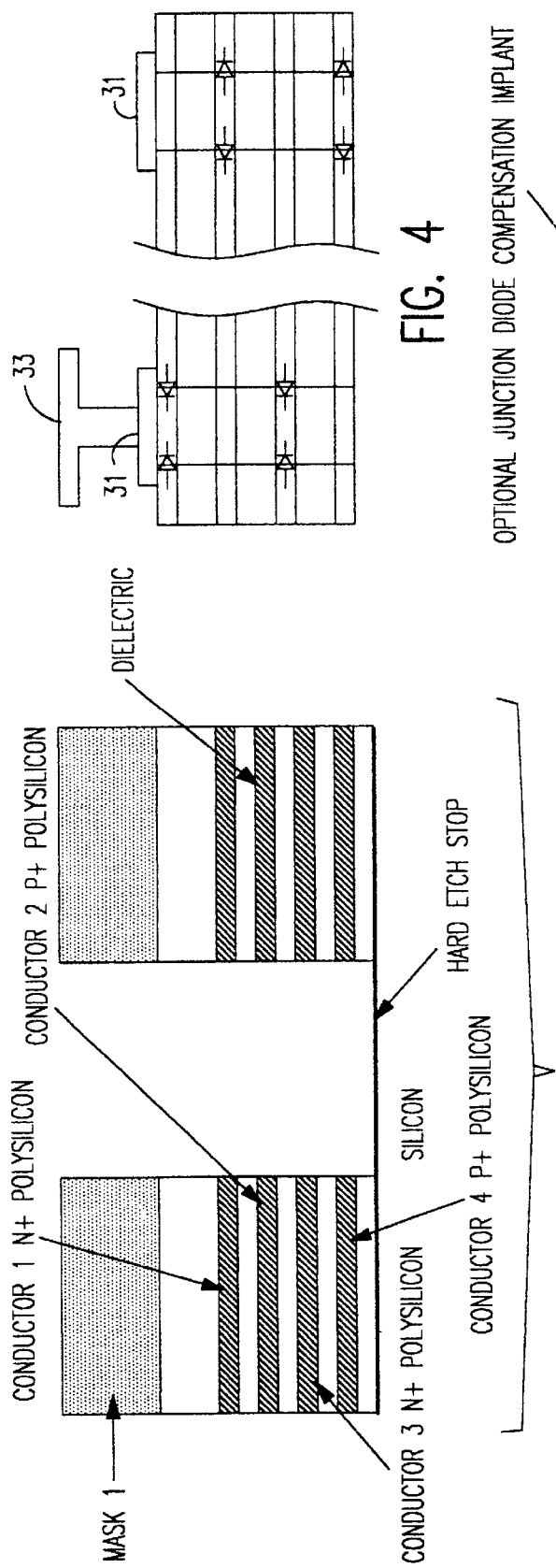
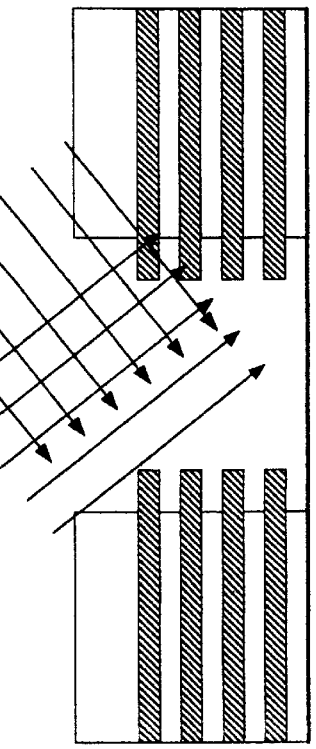
FIG. 4
FIG. 4A
FIG. 4B

INTEGRATED CIRCUIT CAPACITOR

BACKGROUND OF THE INVENTION

1. Field of the Invention

The present invention generally relates to capacitors formed in integrated circuit devices and, more particularly, to the formation of capacitors with relatively large capacitance values at increased manufacturing yields.

2. Description of the Prior Art

Numerous recent advances in integrated circuit designs and increases in integration density have contributed to substantial increases in the clock speed at which the integrated circuits can be reliably operated. Clock rates of 500 MHz are now common and clock rates of 1 GHz or higher are foreseeable within the next few years, However, increases in integration density and scaling of active devices to smaller sizes has required operation at lower voltages for numerous reasons including power dissipation and breakdown voltage. Reduced voltage operation, however, also reduces noise margins. At the same time, increased proximity of active devices and conductors has increased the likelihood of signal coupling between elements of the integrated circuit and reflection of switching noise into the power supply and provided to the active devices on the chip.

Thus, each increase in integrated circuit performance is accompanied by a requirement for increased bypass or decoupling capacitance on the chip allowing switching noise and other noise to be shunted to ground. Off-chip capacitances are ineffective for this purpose at current levels of performance due to the length and number of connections required and the attendant signal propagation time, resistive voltage drops and inductance of the connection. However, as integration density increases, chip space for large capacitors is less readily available.

Numerous capacitor designs are known for providing increased capacitance by increasing area of conductive plates and reducing dielectric thickness. However, at relatively low levels of capacitor structure complexity, the formation of connections to the capacitor plates becomes complicated and compromises manufacturing yield. While some techniques of chip repair are known and widely practiced, the repair of a complex capacitor structure is not generally possible. Providing redundant structures is not generally feasible in view of the chip area required and the likelihood that processing which permitted a defect in one capacitor may cause a defect in other capacitors formed in the same process. Provision of separate processes for separate complex capacitor structures is not economically feasible due to the number of process steps that would be multiplied. Thus, a defect in capacitor formation can cause loss of the entire chip.

SUMMARY OF THE INVENTION

It is therefore an object of the present invention to provide a structure for a large value capacitor and a method by which it can be reliably formed using relatively small chip area.

It is another object of the invention to provide a process-tolerant structure for a large value capacitor including reliably constructed contacts to the electrodes or plates thereof.

It is a further object of the invention to provide an arrangement of large value capacitors which provides for repair while reducing the likelihood that repair will be required and increasing operating margins.

In order to accomplish these and other objects of the invention, a capacitor structure formed in a trench in a semiconductor substrate is provided including a plurality of conductive films separated by a plurality of insulating films, alternating ones of some of the conductive films comprising different materials, and an arrangement such a selective recessing or selective formation of blocking diodes for selectively forming connections to respective ones of said different materials.

In accordance with another aspect of the invention, a method of making selective connections to selected ones of a plurality of conductive films of different materials separated by insulating films is provided comprising steps of forming an aperture through said plurality of conductive films and said insulating films, and filling said aperture with conductive material which selectively forms connections with said different materials.

BRIEF DESCRIPTION OF THE DRAWINGS

The foregoing and other objects, aspects and advantages will be better understood from the following detailed description of a preferred embodiment of the invention with reference to the drawings, in which:

FIGS. 3, 3A and 3B are cross-sectional views showing further formation of a first form of preferred connections to capacitor plates, FIGS. 4, 4A and 4B are cross-sectional views showing further formation of a first form of preferred connections to capacitor plates.

DETAILED DESCRIPTION OF A PREFERRED EMBODIMENT OF THE INVENTION

Figure 1:
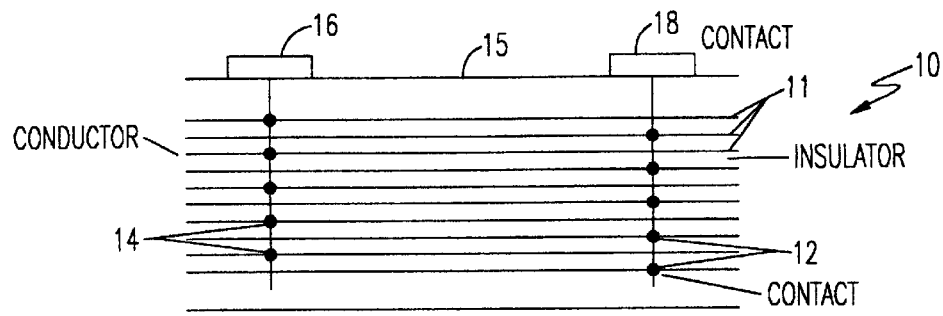
FIG. 1 is a schematic depiction of a capacitor structure in accordance with the invention.

Referring now to the drawings, and more particularly to FIG. 1, there is shown a schematic diagram of a capacitor 10 having a large capacitance value. As is generally known, the value of capacitance of a capacitor structure increases with increased area of opposed plates, increased dielectric constant of material between the capacitor plates and increased proximity of the capacitor plates. Accordingly, the development of structures having increased capacitance value by using a plurality of interleaved plates is also known. However, formation of such a structure as part of an integrated circuit and the development of contacts thereto which are also accessible from a surface of the integrated circuit as schematically depicted in FIG. 1 are not generally known and represent aspects of the invention.

In particular, prior integrated circuit capacitors which have parallel layered plates generally require that a separate connection be made to each layer and thus require additional contact formation steps to be included with the process steps for formation of the conductive and insulating layers as well as additional area for the contacts. Therefore, no portion of FIG. 1 is admitted to be prior art in regard to the present invention. It is also to be understood that opposed plate area can be further expanded in accordance with the invention by techniques shown in other Figures and that FIG. 1 is arranged to facilitate conveyance of an understanding of the invention.

Capacitor 10 preferably includes a stack of conductive films 11 separated by insulators. The insulators are omitted from the depiction of FIG. 1 in the interest of clarity but are illustrated in other Figures. Alternating ones of films 11 are commonly connected at locations such as 12 and 14 by a via-like structure such as a stud or plug and the connections brought out to a surface 15 of the integrated circuit at contacts 16 and 18. Alternatively, connection to one set of the alternating films (e.g. connections 12) can be made through the wafer/chip substrate. The capacitance value can be further increased by using a high dielectric constant material between the materials and/or making the dielectric film very thin. In the preferred embodiment of the invention, the conductive and dielectric films are preferably provided in a trench by a sequence of conformal depositions. This can preferably be accomplished in a single extended operation in a single reactor vessel (e.g. by chemical vapor deposition (CVD)) by changing reactant gases periodically to alternately form conductive and insulating films. The insulating films are preferably oxides or nitrides of tantalum, nickel and the like such as tantalum pentoxide or materials such as barium strontinate (BSTO) and could be grown or deposited on each successive conductor layer. The insulating films can also be composite films (e.g. oxide, nitride, oxide) and formed by the same technique of altering reactants during the same process sequence. These films can be introduced after the high temperature MOS heat treatment are completed, thus allowing for use of otherwise unstable dielectric materials. Integrating these materials with an aluminum or copper metal process is highly feasible since maximum temperature of processes subsequent to the high temperature MOS heat treatment typically do not exceed 600° C.

Figure 2:
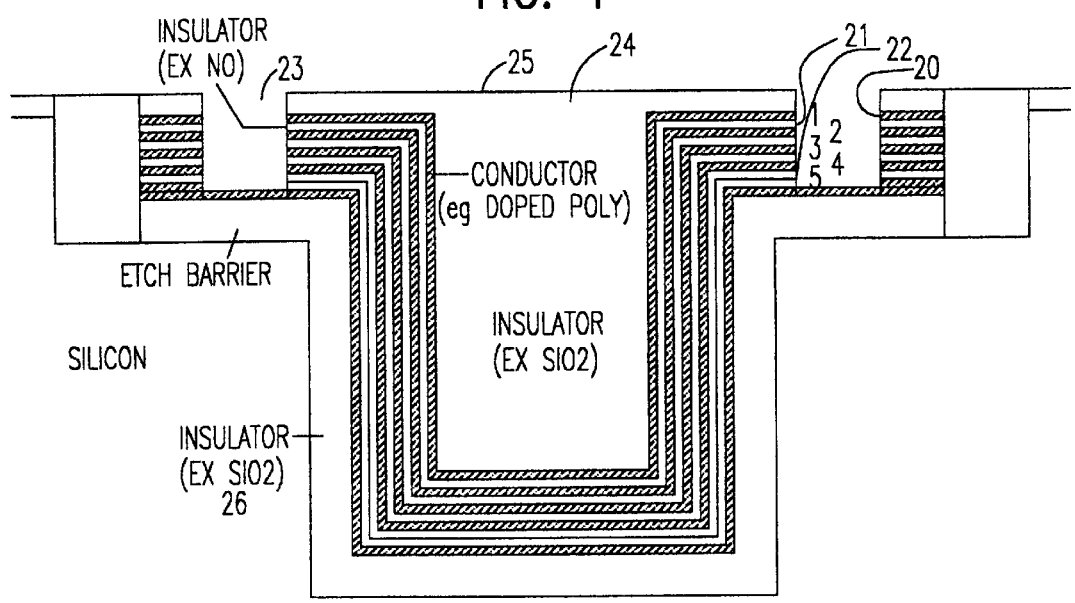
FIG. 2 is a cross-sectional view of an intermediate stage of construction of a capacitor structure in accordance with the invention.

FIG. 2 shows the resulting structure including five conductor films 20, four insulator films 21 and an insulator plug 24 for passivation and planarization within an insulator layer 26 lining the trench for isolation from the substrate. A composite insulator is shown at 22 where it or a layer therein can conveniently form an etch stop for the contact etch. Contact apertures 23 are etched from a surface 25 of the structure through all conducting and insulating films above the etch stop layer of composite insulator 22. The conductors may be fabricated from many conducting materials such as tungsten or p+ doped semiconductor, or the like. Preferably, in one variant form of the invention, it is preferred to choose conductive materials which may be etched selectively to each other as will be discussed in greater detail below.

As a perfecting feature of the invention, the conductive and insulative films are preferably formed conformally within a trench which is preferably of high aspect ratio. That is, the depth of the trench is preferably two to ten times as great (e.g. eight to ten micrometers) as the width of the trench. Thus, as alluded to above, the shape of the trench imparts an undulating cross-section to the conductive and insulating films and thus serves to further increase/multiply opposed plate area. The insulating films may be made as thin as 50 Angstroms while maintaining good integrity at the present state of the art but thinner insulators (implying increased capacitance) can be foreseen and utilized as improvements in control of deposition processes are achieved. Conductive films are typically ten to twenty times as thick even though such a thickness does not ensure that non-conductive or high resistance local regions will not result. However, any such regions will generally be of negligible effect.

While the insulator film must be continuous to avoid shorting of conductive films, inhomogeneities in the conductive films are of little importance as long as there is some electrical conductive path to substantially the entire area of each plate. This relaxed continuity requirement allows the use of very thin conductive plates. By the same token, since a relatively large capacitance value is available, two such capacitors may be connected in series or connections formed that develop two series capacitors in the same trench. While such an arrangement would reduce the effective capacitance value, it also would reduce the voltage across respective dielectric layers and reduce the impact of defects in the insulator films.

A capacitor fabricated in accordance with the invention having a one micrometer square surface area (and assuming a dielectric constant similar to a nitride or oxide) the capacitance between two conductive films would be about 500 picofarads (pF). If four plates are connected in parallel, the available capacitance of two nanofarads (nF) would be available. Similarly ten plates would yield 5 nF. Very slight increases in area can thus yield substantial increases in capacitance.

Figure 3:
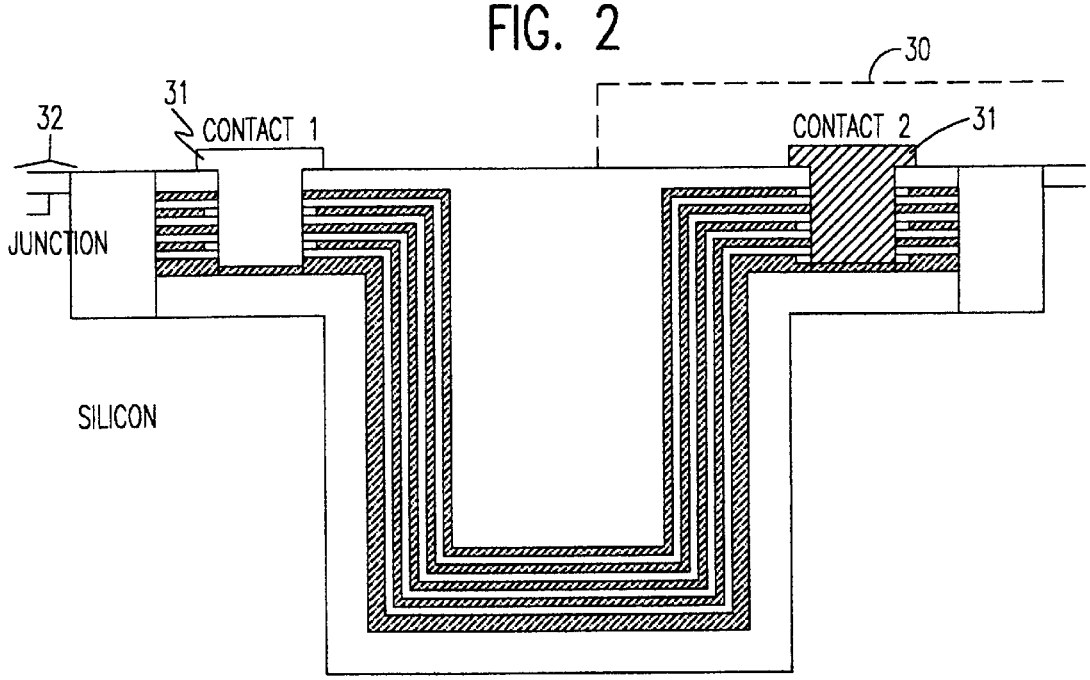

Referring now to FIGS. 3 and 4, the preferred techniques for making connections to the conductive film plates 11 will be discussed. The two preferred techniques are referred to as etch selective (illustrated in FIG. 3) and a blocking diode approach (illustrated in FIG. 4), respectively. It is to be understood that these techniques may be used in combination to obtain various desired connection schemes that may result in series connection of more than one capacitor in a single trench.

The selective etch approach illustrated in FIG. 3 is preferably performed by using alternating conductive plates/films of, for example, tungsten or titanium nitride (which can be selectively etched with peroxide) and p+ doped polysilicon (which can selectively etched with a CDE tool). The important aspect of this approach is that the alternating films can be etched selectively to each other. Once the contact apertures 23 has been formed, preferably by etching in accordance with a patterned resist, a block-out mask 30 is applied over one of the apertures 23 and a selective etch for one of the conductive films (e.g. tungsten) is conducted to recess alternating plates (e.g. 2 and 4 of FIG. 2). A selective deposition is carried out and an anisotropic etch is used to reopen the aperture leaving films 1, 3 and 5 exposed and films 2 and 4 insulated.

The resist is then stripped and another blockout mask is applied to the other aperture and a selective etch of the other conductive material is carried out to recess the other conductive films (e.g. 1, 3 and 5) in the other aperture. Another selective deposition and anisotropic etch serves to insulate films 1, 3 and 5 while leaving edges of films 2 and 4 exposed. The resist is then stripped and an interlayer dielectric (ILD) material film is deposited in the apertures. This material can be the same as that already present in the capacitor dielectric layers and no mask is required. This ILD film fills the recesses selectively etched in the capacitor plates as shown in FIG. 3A. (FIG. 3A and FIG. 3B illustrate only four capacitor plates, for clarity and to further indicate the number of plates is arbitrary.)

Then, as shown in FIG. 3B, the ILD film is anisotropically etched and the etch continued to further etch back the capacitor dielectric layer preferably to a distance about one-half of the conductive layer selective recess. This etch process (preferably a reactive ion etch (RIE) or dilute (e.g. 500:1) hydrofluoric acid etch) slightly enlarges the openings 23 leaving alternate conductive layers extending into the aperture while insulating material remains between the perimeter of the aperture 23 and the recessed plates. Conductive material can then be deposited in the apertures to form vias/studs/plugs 31 and complete the capacitor by forming respective connections to alternating conductive films.

In a variant form of the selective etch approach, apertures 23 can be etched to different depths (possibly using optical emission spectroscopy to count films as they are etched) in separate operations (e.g. after connections to upper plates/films are made with vias filling a shallow aperture 23) and reopening of the apertures 23 to an increased depth but with reduced transverse dimensions such that upper conductors remain selectively insulated and essentially forms a coaxial. via. Alternatively, limitation of the extent of groups of films can be achieved with block-out masks during earlier plate formations and the apertures 23 and multiple vias formed through different respective groups of films extending into locations where other plates are foreshortened. Other techniques will be apparent to those skilled in the art in view of these possible alternatives.

Referring now to FIGS. 4, 4A and 4B, the blocking diode approach to capacitor plate/film connections will be discussed. In this case, it is not necessary to undercut alternating plates by selective etching as described above or otherwise carry out different processing for the respective contact apertures. Accordingly, masking and etching processes are avoided by the expedient of forming alternating conductive films of p+ and n+doped polysilicon. (Some films can be formed of metal, as well, if this approach is employed in combination with the selective etch approach described above.)

Thus, assuming etching of the apertures 23 to an etch stop (or to any other desired depth) and an optional etch back of the dielectric as shown in FIG. 4A, one aperture 23 is masked and exposed apertures 23 are filled with n+ doped polysilicon. Then the block-out mask is stripped and p+ polysilicon deposited in the remaining apertures 23. Thus, the p+ polysilicon plug/via/stud connects to the p+ films while a blocking diode is formed at the junction with the n+ films. Likewise, the n+ plug/via/stud connects to the n+ films but forms a blocking diode with the p+ films.

Optionally, as shown in FIG. 4B, a junction diode compensation implant may be performed prior to filling of apertures 23 with respective doped semiconductor material. This implant allows the reverse breakdown characteristic of the diodes to be determined as may be desired for voltage transient and electrostatic discharge protection; shunting the capacitors and increasing device reliability. Such diodes may be connected to the I/O pads 33, as shown in FIG. 4 and used for electrostatic discharge (ESD) protection, if desired. Additionally, the forward voltage drop reduces the voltage which appears across the capacitor dielectric.

In this regard, polysilicon diodes typically exhibit more leakage than monocrystalline diodes but recent advances have brought leakage to generally comparable levels. At the present time and with capacitor dimensions discussed above, leakage will be in the range of about ten to one hundred nanoamps which is comparable to leakage in some discrete electrolytic capacitors. This level of leakage is considered tolerable in bypass/decoupling capacitor applications and adds a small amount of standby leakage when used in and ESD protection application. The invention is thus seen to provide a capacitor having electrical characteristics comparable to a discrete device but which can be integrated with other circuits on a chip and which requires only a small amount of chip space.

As alluded to above, either of these approaches to forming connections to the capacitor plate films is adequate when only a single capacitor is to be formed in a trench. The variant forms of the selective etch approach using apertures 23 of differing depths is equally applicable to the blocking diode approach, as well. Further, the two approaches can be used together in various combinations and/or in their respective variant forms to establish virtually any desired pattern of connections.

Figure 5:
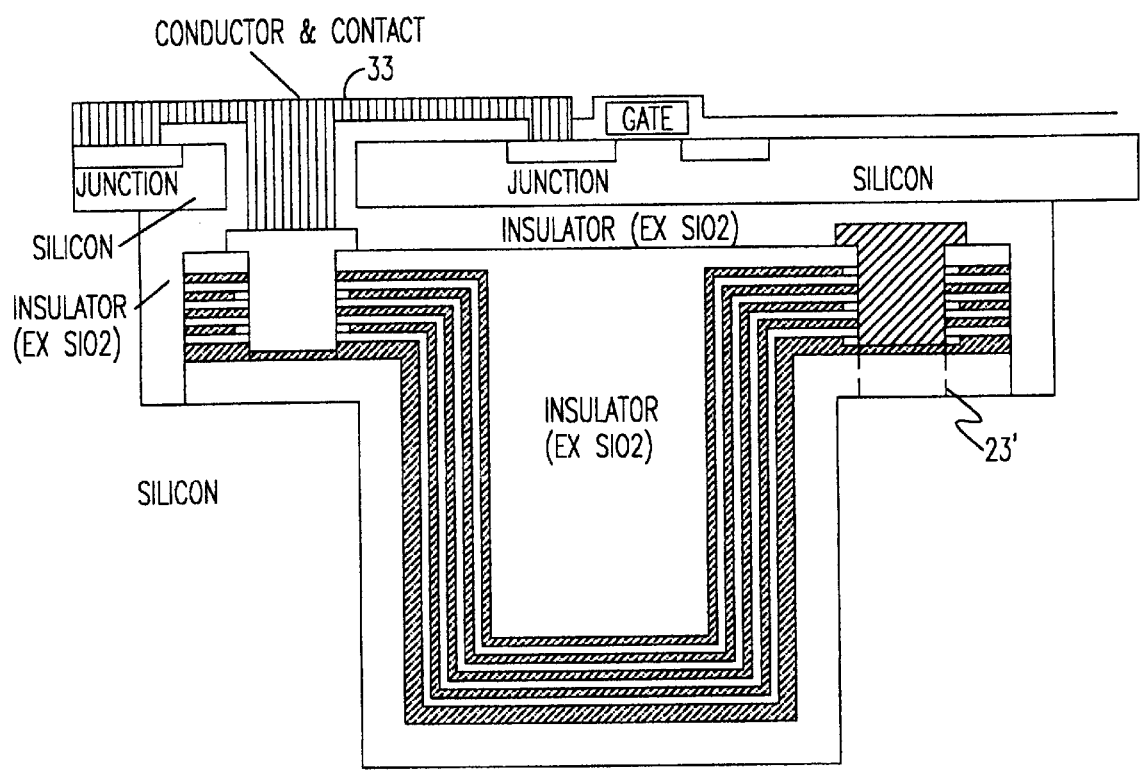
FIG. 5 is a cross-sectional view showing further formation of integrated circuit elements with the structure of FIG. 2 in combination with a silicon-on-insulator wafer.

Referring now to FIGS. 3 and 5, it should be understood that when a capacitor the invention is formed on a normal monocrystalline or bulk silicon wafer, other elements of the integrated circuit are normally formed outside the region of the capacitor as indicated at 32 of FIG. 3. However, it is also possible to apply the invention to a silicon-oninsulator (SOI) wafer or substrate structure. Specifically, an insulator can be formed over the wafer surface including the capacitor structure and an epitaxial silicon layer grown thereover. Alternatively the bulk silicon layer of a SOI wafer can be removed, the capacitor formed and the insulator layer and monocrystalline active device layer bonded thereto. Other techniques may also be applied as will be understood by those skilled in the art. By appropriate choice of such techniques, many potential defects in the capacitor structure may be repaired while providing expanded latitude of formation of functional capacitors.

In any case, the entire surface of the active device layer of the SOI chip (but for the capacitor connections) is available for formation of other integrated circuit elements, as shown in FIG. 4. Further, as shown in FIG. 4, it is often convenient to make one of the capacitor connections through the bulk silicon layer, preferably by carrying the etch of one aperture 23 through insulator 26 within the trench to the bulk silicon as shown at 23'.

In view of the foregoing, it is seen that the invention provides for a capacitor of large value and suitable for use as a bypass/decoupling capacitor formed in a small area and with reduced criticality of formation of conductive and insulative layers, increasing process tolerances for production of operable devices and increasing manufacturing yield. Repair of many potential defects may be provided for and repairs effected by, for example, opening connection apertures using laser ablation as well as masked etching. Discontinuities in capacitor plate films can also be corrected by opening the apertures and shorting a plate to another similarly connected plate or a separate connection made from the wafer surface.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A capacitor structure formed in a trench in a semiconductor substrate including
   a plurality of conductive films separated by a plurality of insulating films, alternating ones of some of said conductive films comprising different materials, and
   means for selectively forming connections to respective ones of said different materials, said connections being formed at respective edges of said plurality of conductive films within said trench.

2. A capacitor structure as recited in claim 1, wherein said plurality of conductive films and said plurality of insulating films are conformally deposited in said trench.

3. A capacitor structure as recited in claim 1, further including an isolation layer in said trench for isolating said capacitor structure from said substrate.

4. A capacitor structure as recited in claim 3, further including an etch stop layer overlaying said isolation layer.

5. A capacitor structure as recited in claim 1, further including an etch stop layer within said trench.

6. A capacitor structure as recited in claim 1, wherein said means for selectively forming connections includes
- an aperture wherein selected ones of said plurality of conductive films are recessed from a perimeter of said aperture, and
- insulating material between said perimeter of said aperture and recessed surfaces said selected ones of said plurality of conductive films.

7. A capacitor structure as recited in claim 6 wherein ones of said conductive films other than said selected ones of said plurality of conductive films extend within a perimeter of said aperture.

8. A capacitor structure as recited in claim 1, wherein said different materials are oppositely
- doped semiconductor materials, and wherein said means for selectively forming connections includes doped semiconductor studs respectively forming connections and blocking diodes with said conductive films.

9. A capacitor structure as recited in claim 8, further including
- a compensation implant in said blocking diodes.

10. A capacitor structure as recited in claim 9, further including
- an electrostatic discharge protection means including said compensation implant.

11. An electrostatic discharge protection device including
- a capacitor structure formed in a trench in a substrate comprising
- a plurality of conductive films separated by a plurality of insulating films, alternating ones of some of said conductive films comprising different materials,
- means for selectively forming connections to respective ones of said different materials,
- doped semiconductor studs respectively forming connections and blocking diodes with said conductive films, said conductive films including a compensation implant.

12. Apparatus comprising
- a substrate having a trench formed therein,
- a plurality of conductive layers having a plurality of insulating layers therebetween and having a first terminal on a surface of the substrate on a first side of the trench and a second terminal on a second side of the trench, wherein the conductive layers and the insulating layers extend substantially continuously from the first terminal, along a first sidewall of the trench, along a bottom of the trench, along a second sidewall of the trench, to the second terminal, wherein the first and second terminals are each comprised of conductive material and edges of selected ones of the plurality of conductive layers are electrically coupled only to the first terminal within the trench and edges of others of the plurality of conductive layers are electrically coupled only to the second terminal within the trench.

* * * * *